(12) United States Patent
Neya et al.

(10) Patent No.: US 12,349,494 B2
(45) Date of Patent: Jul. 1, 2025

(54) LIGHT RECEIVING DEVICE AND DISTANCE MEASURING DEVICE

(71) Applicant: SONY SEMICONDUCTOR SOLUTIONS CORPORATION, Kanagawa (JP)

(72) Inventors: Koji Neya, Kanagawa (JP); Akira Matsumoto, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 470 days.

(21) Appl. No.: 17/755,336

(22) PCT Filed: Sep. 9, 2020

(86) PCT No.: PCT/JP2020/034038
§ 371 (c)(1),
(2) Date: Apr. 27, 2022

(87) PCT Pub. No.: WO2021/090569
PCT Pub. Date: May 14, 2021

(65) Prior Publication Data
US 2022/0375980 A1    Nov. 24, 2022

(30) Foreign Application Priority Data
Nov. 6, 2019   (JP) ................ 2019-201729

(51) Int. Cl.
*G01S 7/48*         (2006.01)
*G01S 7/481*        (2006.01)
(Continued)

(52) U.S. Cl.
CPC .......... *H10F 39/809* (2025.01); *G01S 7/4816* (2013.01); *G01S 7/4865* (2013.01); *G01S 17/10* (2013.01); *H10F 39/18* (2025.01)

(58) Field of Classification Search
CPC ................ G01J 9/00; H01L 27/14634; H01L 27/14643; H01L 21/822; H01L 27/04;
(Continued)

(56) References Cited

U.S. PATENT DOCUMENTS

2009/0236496 A1   9/2009   Tanada et al.
2010/0201966 A1   8/2010   Mase et al.
(Continued)

FOREIGN PATENT DOCUMENTS

CN   101688915 A   3/2010
CN   101950750 A   1/2011
(Continued)

OTHER PUBLICATIONS

International Search Report and Written Opinion of PCT Application No. PCT/JP2020/034038, issued on Nov. 2, 2020, 11 pages of ISRWO.

*Primary Examiner* — Tony Ko
(74) *Attorney, Agent, or Firm* — CHIP LAW GROUP

(57) ABSTRACT

A light receiving device (3) includes a first circuit substrate (10) and a second circuit substrate (20). An avalanche photodiode (APD) (101) and a protection element (130) that protects the APD (101) are disposed on the first circuit substrate (10). The second circuit substrate (20) is stacked on the first circuit substrate (10), and a signal processing circuit that processes a signal output from the APD (101) is disposed on the second circuit substrate (20).

7 Claims, 10 Drawing Sheets

(51) Int. Cl.
*G01S 7/4865* (2020.01)
*G01S 17/10* (2020.01)
*H10F 39/00* (2025.01)
*H10F 39/18* (2025.01)

(58) Field of Classification Search
CPC ... H01L 27/146; G01S 7/4816; G01S 7/4865; G01S 17/10; G01S 7/4863; H04N 25/70; G01C 3/06
See application file for complete search history.

(56) References Cited

U.S. PATENT DOCUMENTS

| | | |
|---|---|---|
| 2010/0328916 A1 | 12/2010 | Hirose et al. |
| 2013/0105924 A1 | 5/2013 | Kobayashi et al. |
| 2017/0244244 A1 | 8/2017 | Ikeda |
| 2019/0222733 A1 | 7/2019 | Nishide et al. |
| 2021/0193707 A1* | 6/2021 | Ishida ............... H01L 27/14634 |

FOREIGN PATENT DOCUMENTS

| | | |
|---|---|---|
| CN | 104810354 A | 7/2015 |
| CN | 107104099 A | 8/2017 |
| CN | 109791937 A | 5/2019 |
| EP | 2166373 A1 | 3/2010 |
| EP | 3525238 A1 | 8/2019 |
| JP | 2007-012864 A | 1/2007 |
| JP | 2009-014459 A | 1/2009 |
| JP | 2009-260305 A | 11/2009 |
| JP | 2010-245506 A | 10/2010 |
| JP | 2011-029614 A | 2/2011 |
| JP | 2012-033878 A | 2/2012 |
| JP | 2017-152462 A | 8/2017 |
| JP | 2018-060980 A | 4/2018 |
| JP | 2018-137284 A | 8/2018 |
| KR | 10-2010-0033368 A | 3/2010 |
| KR | 10-2011-0001939 A | 1/2011 |
| TW | 201110317 A | 3/2011 |
| WO | 2009/005098 A1 | 1/2009 |
| WO | 2012/001915 A1 | 1/2012 |
| WO | 2018/066225 A1 | 4/2018 |
| WO | 2018/150801 A1 | 8/2018 |

* cited by examiner

LIGHT RECEIVING DEVICE AND DISTANCE MEASURING DEVICE

CROSS REFERENCE TO RELATED APPLICATIONS

This application is a U.S. National Phase of International Patent Application No. PCT/JP2020/034038 filed on Sep. 9, 2020, which claims priority benefit of Japanese Patent Application No. JP 2019-201729 filed in the Japan Patent Office on Nov. 6, 2019. Each of the above-referenced applications is hereby incorporated herein by reference in its entirety.

FIELD

The present disclosure relates to a light receiving device and a distance measuring device.

BACKGROUND

As one of distance measurement methods for measuring a distance to an object to be measured using light, a distance measurement method called a direct time of flight (ToF) method is known. In the distance measurement processing by the direct ToF method, a time from an emission timing indicating emission of light by a light source to a light reception timing at which reflected light which is the light reflected on an object to be measured is received by a light receiving element is measured, and a distance to the object to be measured is obtained on the basis of the measured time.

In addition, in a light receiving device including the light receiving element described above, there is a three-dimensional mounting technology in which a plurality of semiconductor substrates is stacked. For example, in the light receiving device, a configuration in which a first circuit substrate on which a pixel region is formed and a second circuit substrate on which a logic circuit and a protection element that protects a light receiving element are formed are stacked is known (see, for example, Patent Literature 1).

CITATION LIST

Patent Literature

Patent Literature 1: JP 2010-245506 A

SUMMARY

Technical Problem

However, in the related art, since a dedicated region for disposing the light receiving element is required, the area of the second circuit substrate is increased, and the area of the entire chip cannot be reduced in some cases.

Therefore, the present disclosure proposes a light receiving device and a distance measuring device capable of reducing the area of the entire chip.

Solution to Problem

To solve the problem described above, a light receiving device according to the present disclosure includes a first circuit substrate and a second circuit substrate. An avalanche photodiode and a protection element that protects the APD are disposed on the first circuit substrate. The second circuit substrate is stacked on the first circuit substrate, and a signal processing circuit that processes a signal output from the APD is disposed on the second circuit substrate.

DESCRIPTION OF EMBODIMENTS

Figure 1:
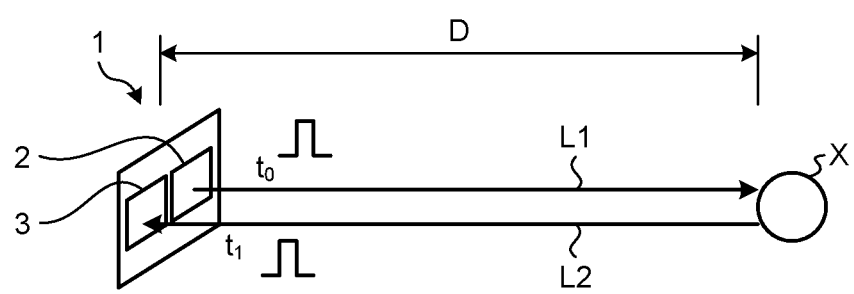
FIG. 1 is a diagram illustrating a distance measurement method of a distance measuring device according to an embodiment.

Hereinafter, embodiments of the present disclosure will be described in detail with reference to the drawings. In each of the following embodiments, the same parts are denoted by the same reference numerals, and redundant description will be omitted.

Furthermore, in the specification and the drawings, a plurality of constituent elements having substantially the same functional configuration may be distinguished from one another by adding different numbers after the same reference numeral. However, if it is not necessary to distinguish the plurality of constituent elements having substantially the same functional configuration from one another, only the same reference numeral is given.

Embodiment

First, a distance measuring device according to an embodiment will be described with reference to FIG. 1.

FIG. 1 is a diagram illustrating a distance measurement method of the distance measuring device according to the embodiment. In FIG. 1, as one of distance measurement methods for measuring a distance to an object to be measured using light, a distance measurement method called a direct ToF method is described. In the direct ToF method, light emitted from a light source is reflected by an object to be measured, reflected light is received by a light receiving element, and a distance to an object is measured on the basis of a time duration from when the light is emitted to when the light is received as the reflected light.

Specifically, the direct ToF method is a method in which reflected light L2 generated by emitted light L1 from a light source device 2 being reflected by an object to be measured X is received by a light receiving device 3, and the distance measurement is performed on the basis of the time of the difference between the light emission timing and the light reception timing.

A distance measuring device 1 includes the light source device 2 and the light receiving device 3. The light source device 2 includes a light source, for example, a laser diode, and is driven to emit laser light in a pulsed manner.

The emitted light L1 from the light source device 2 is reflected by the object to be measured X and received by the light receiving device 3 as the reflected light L2. The light receiving device 3 includes a light receiving element (APD 101 to be described later) that converts light into an electrical signal by photoelectric conversion, and outputs a signal corresponding to the received light.

Here, the time (light emission timing) when the light source device 2 emits light is time t0, and the time (light reception timing) when the light receiving device 3 receives the reflected light L2 generated by the emitted light L1 from the light source device 2 being reflected by the object to be measured X is time t1.

Assuming that the constant c is a light velocity (2.9979× 108 [m/sec]), the distance D between the distance measuring device 1 and the object to be measured X is calculated by the following equation (1).

$$D=(c/2)\times(t1-t0) \tag{1}$$

Figure 2:
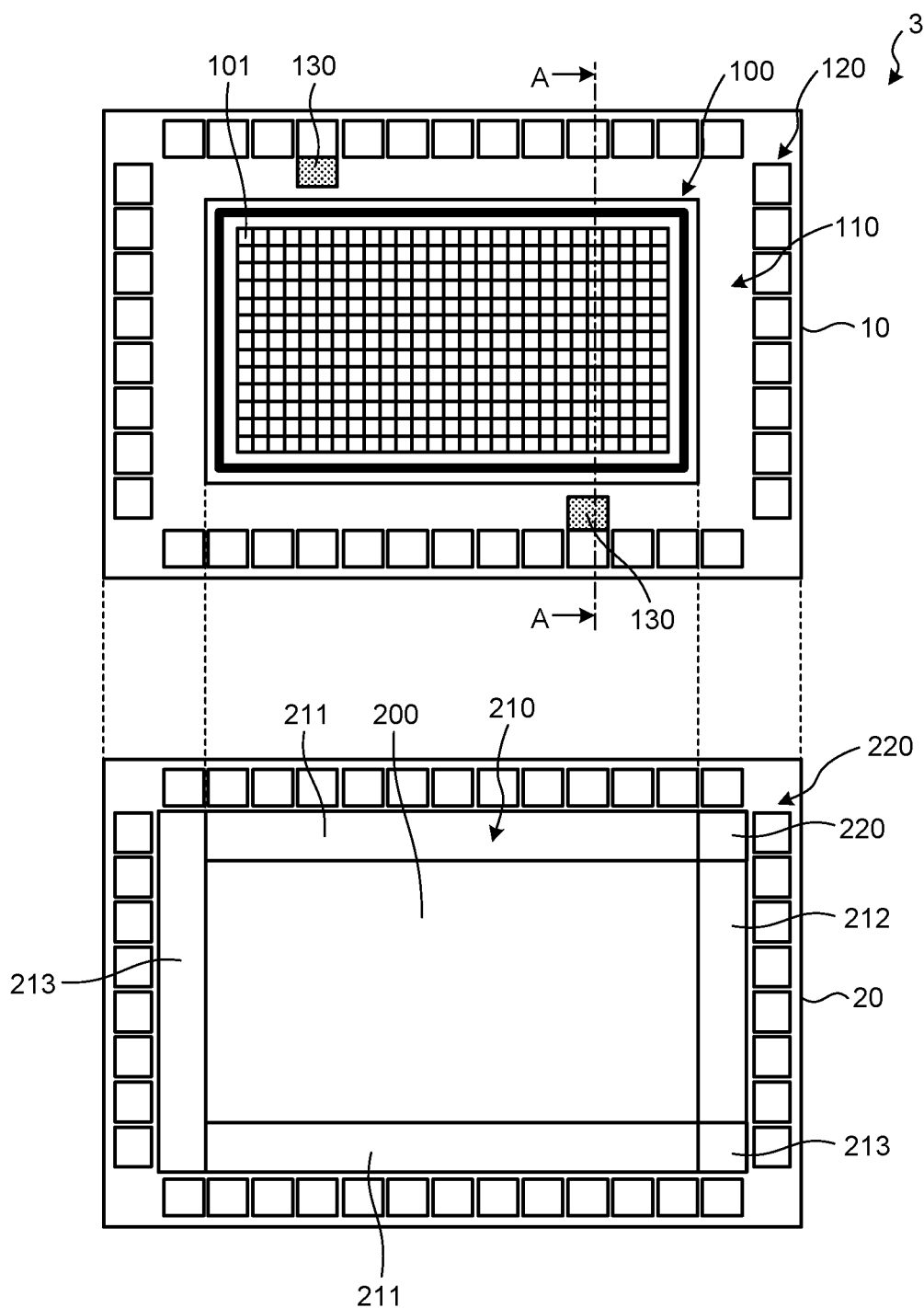
FIG. 2 is a diagram illustrating a circuit substrate included in a light receiving device according to the embodiment.

Next, a circuit substrate of the light receiving device 3 included in the distance measuring device 1 will be described with reference to FIG. 2. FIG. 2 is a diagram illustrating a circuit substrate included in the light receiving device 3 according to the embodiment. FIG. 2 illustrates a top view of a first circuit substrate 10 and a second circuit substrate 20 stacked on each other.

As illustrated in FIG. 2, the light receiving device 3 includes the first circuit substrate 10 and the second circuit substrate 20. For example, the first circuit substrate 10 is stacked on an upper layer or a lower layer of the second circuit substrate 20.

As illustrated in FIG. 2, the first circuit substrate 10 includes a pixel region 100 disposed at the center in top view, a peripheral region 110 disposed outside so as to surround the pixel region 100, and a pad region 120 disposed outside so as to surround the peripheral region 110.

Avalanche photodiodes (APDs) 101 are disposed in an array in the pixel region 100. Specifically, the APDs 101 are two-dimensionally arranged along each of the long side direction and the short side direction of the first circuit substrate 10.

In addition, the APDs 101 are preferably single photon avalanche diodes (SPADs). The SPADs have a characteristic that when a large negative voltage that generates avalanche multiplication is applied to an anode, electrons generated in response to incidence of one photon generate avalanche multiplication, and a large current flows. By using this characteristic of the SPADs, incidence of one photon can be detected with high sensitivity.

In the peripheral region 110, a protection element 130 to be described later is disposed. The protection element 130 is an electro-static discharge (ESD) protection element that protects the APDs 101, and is disposed with an area corresponding to a region area of the APDs 101 (the number of APDs 101).

In FIG. 2, two protection elements 130 are divided and disposed in the peripheral region 110. That is, the total area of the two protection elements 130 is the area of the protection element 130 corresponding to the region area of the APDs 101. Note that the number of divisions of the protection element 130 is not limited to two, and may be three or more, or may be one protection element 130 without division.

An electrode pad 121 to be described later is located in the pad region 120. Although the case where the electrode pad 121 is provided on the second circuit substrate 20 has been described, the electrode pad may be provided on the first circuit substrate 10.

Next, the second circuit substrate 20 includes a pixel circuit region 200 disposed at the center in top view, a peripheral circuit region 210 disposed outside so as to surround the pixel circuit region 200, and a pad region 220 disposed outside so as to surround the peripheral circuit region 210.

The position of the pixel circuit region 200 corresponds to the position of the pixel region 100, the position of the peripheral circuit region 210 corresponds to the position of the peripheral region 110, and the position of the pad region 220 corresponds to the position of the pad region 120.

In the pixel circuit region 200, a circuit that processes a signal output from the APDs 101, a circuit that supplies power to the APDs 101, and the like are formed. Specifically, transistors Tr1 and Tr2 (see FIG. 5), an inverter INV (see FIG. 5), and the like, which will be described later, are disposed in the pixel circuit region 200.

In the peripheral circuit region 210, a readout circuit 211, a phase locked loop (PLL) circuit 212, and various processing circuits 213 are disposed. The readout circuit 211 is, for example, a time to digital converter (TDC) circuit.

Herein, conventionally, the protection element that protects the APDs is disposed in the peripheral circuit region of the second circuit substrate. For this reason, conventionally, since a circuit of the protection element is required in addition to the region for the above configuration, it has been difficult to narrow the peripheral circuit region. Further, when the peripheral circuit region is increased, the peripheral circuit of the first circuit substrate inevitably needs to be increased, which leads to an increase in size of the chip. In addition, conventionally, since the protection element and the peripheral circuit are disposed on the same substrate, there is a possibility that characteristics of the APDs may be degraded or the peripheral circuit may be adversely affected by latch-up noise or substrate noise.

Therefore, in the present embodiment, the protection element 130 is provided on the first circuit substrate 10. Specifically, the APDs 101 and the protection element 130 are disposed on the first circuit substrate 10. In addition, a signal processing circuit that processes a signal output from the APDs 101 is disposed on the second circuit substrate 20.

As a result, it is not necessary to secure a region for the protection element 130 on the second circuit substrate 20. Further, by disposing the protection element 130 in the peripheral region 110, it is not necessary to secure a region dedicated to the protection element 130 in the first circuit substrate 10.

That is, according to the light receiving device 3 of the embodiment, it is not necessary to secure the dedicated region of the protection element 130, so that the area of the chip can be reduced. Furthermore, since the step of forming the protection element 130 can be omitted in the second circuit substrate 20, cost reduction can be realized by reducing the number of steps of the second circuit substrate 20.

In addition, since the various circuits disposed on the second circuit substrate 20 and the protection element 130 are not disposed on the same substrate, the influence of substrate noise, latch-up noise, and the like can be suppressed, and thus, characteristic degradation of the APDs 101 and adverse effects on peripheral circuits can be suppressed.

Figure 3:
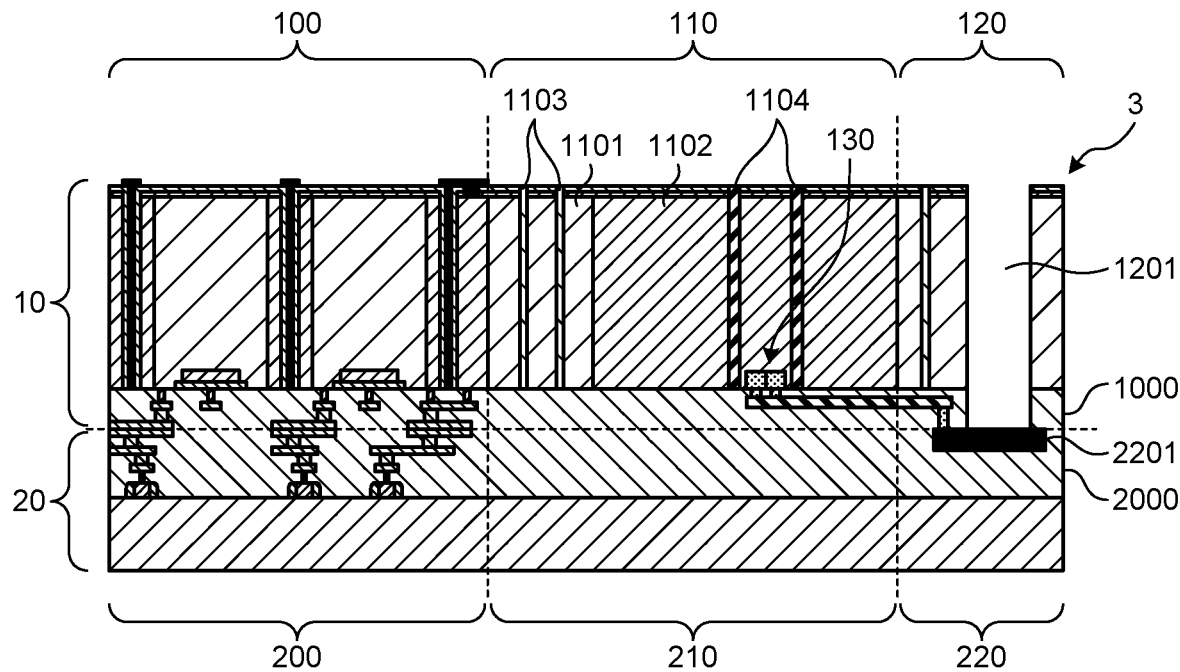
FIG. 3 is a cross-sectional view of the light receiving device.

Next, a cross section of the light receiving device 3 will be described with reference to FIG. 3. FIG. 3 is a cross-sectional view of the light receiving device 3. FIG. 3 illustrates a cross section of the light receiving device 3 taken along line A-A illustrated in FIG. 2.

As illustrated in FIG. 3, the APDs 101 are formed in the pixel region 100 of the first circuit substrate 10. For example, in the APDs 101, an n-type semiconductor region and a p-type semiconductor region are formed at the bottom portion of the well layer, and a metal film serving as a light shielding portion, an isolation region for isolating adjacent APDs 101, and the like are formed at the side portion of the well layer.

The peripheral region 110 of the first circuit substrate 10 includes an n-type semiconductor region 1101 and a p-type semiconductor region 1102. The protection element 130 is formed in the p-type semiconductor region 1102. For example, the protection element 130 is formed in a position surrounded by an insulating portion 1104 (for example, trenches) formed in the p-type semiconductor region 1102.

In addition, two trenches 1103 are formed in the n-type semiconductor region 1101. The trench 1103 is provided to separate the pixel region 100 and the peripheral region 110. Note that it is sufficient that at least one trench 1103 is formed.

In the pad region 120, a pad opening 1201, which is a hole extending from the upper end of the first circuit substrate 10 to the inside of a wiring layer 1000 in the vertical direction and is a hole for wiring to the electrode pad 2201, is formed.

Specifically, the pad opening 1201 is an opening that reaches the electrode pad 2201 for wiring provided in the pad region 220 of the second circuit substrate 20. Note that the pad opening 1201 is formed after the first circuit substrate 10 and the second circuit substrate 20 are bonded together. The electrode pad 2201 is used, for example, when connected to wiring in the wiring layer 1000 or connected to another external device.

In addition, the wiring layer 1000 in the first circuit substrate 10 and a wiring layer 2000 in the second circuit substrate 20 are formed including a plurality of wirings, and the plurality of wirings and the electrode pads 2201 are formed of metal such as copper (Cu) or aluminum (Al), for example.

The first circuit substrate 10 and the second circuit substrate 20 are stacked by bonding the wiring layers 1000 and 2000 to each other. As a result, the APDs 101 in the pixel region 100 and various circuits in the pixel circuit region 200 are electrically connected, and the protection element 130 in the peripheral region 110 and the electrode pad 2201 in the pad region 220 are electrically connected.

Figure 4:
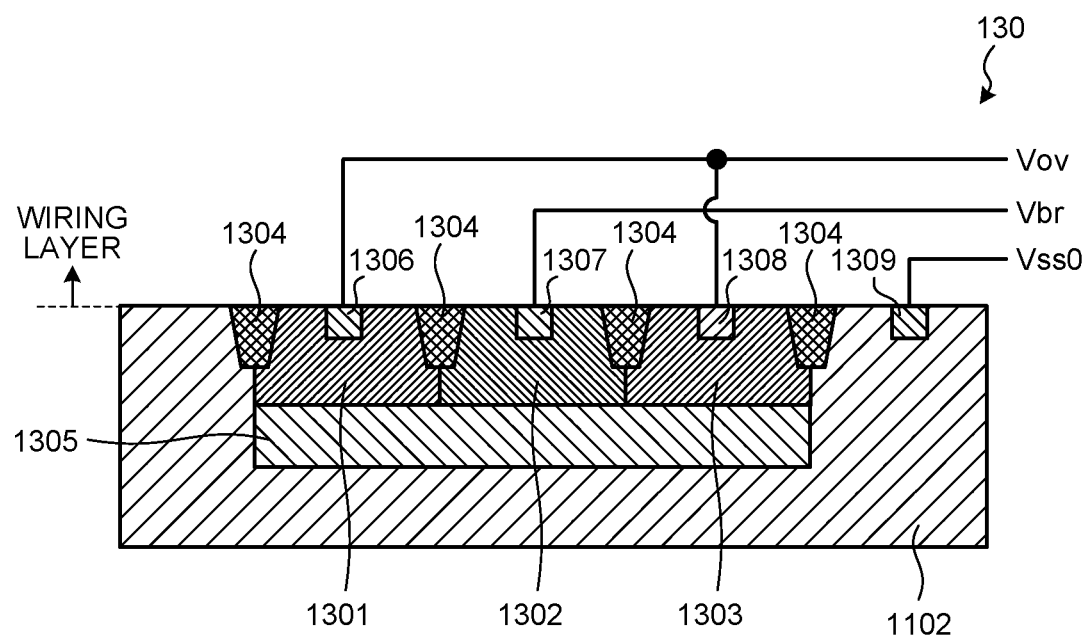
FIG. 4 is a schematic view illustrating a cross-sectional structure of a protection element.

Next, a cross-sectional structure of the protection element 130 will be described in detail with reference to FIG. 4. FIG. 4 is a schematic view illustrating a cross-sectional structure of the protection element 130.

The protection element 130 is an element having a PN junction, and is, for example, a bipolar transistor type ESD protection element. Specifically, as illustrated in FIG. 4, the protection element 130 includes an n-well layer 1301 (n-type semiconductor region), a p-well layer 1302 (p-type semiconductor region), and an n-well layer 1303 (n-type semiconductor region) on the surface on the wiring layer 1000 side in the p-type semiconductor region 1102. In addition, the n-well layer 1301, the p-well layer 1302, and the n-well layer 1303 are separated from each other by a separation region 1304.

In addition, the protection element 130 includes a deep n-well layer 1305 (high-concentration n-type semiconductor region) in a region deeper than the n-well layer 1301, the p-well layer 1302, and the n-well layer 1303.

Further, in the n-well layer 1301, a high-concentration p-type semiconductor region 1306 to be a connection point with a voltage source Vov of positive voltage is formed. Further, in the p-well layer 1302, a high-concentration p-type semiconductor region 1307 to be a connection point with a voltage source Vbr of negative voltage is formed. Further, in the n-well layer 1303, a high-concentration n-type semiconductor region 1308 to be a connection point with the voltage source Vov of positive voltage is formed. Further, in the p-type semiconductor region 1102, a high-concentration p-type semiconductor region 1309 to be a connection point with a reference voltage Vss0 (for example, 0V) is formed.

That is, the protection element 130 illustrated in FIG. 4 is a bipolar transistor having a triple well structure of PNP junction using the p-type semiconductor region 1102 as a substrate. Note that the protection element 130 may have an n-type semiconductor region as a substrate or may have a triple well structure of NPN junction, which will be described later.

Figure 5:
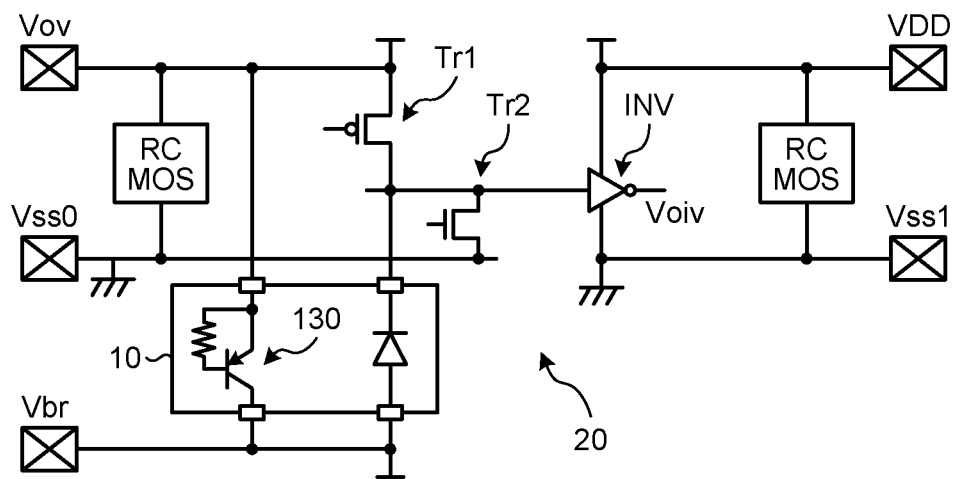
FIG. 5 is a diagram illustrating a circuit configuration of the light receiving device.
Figure 6:
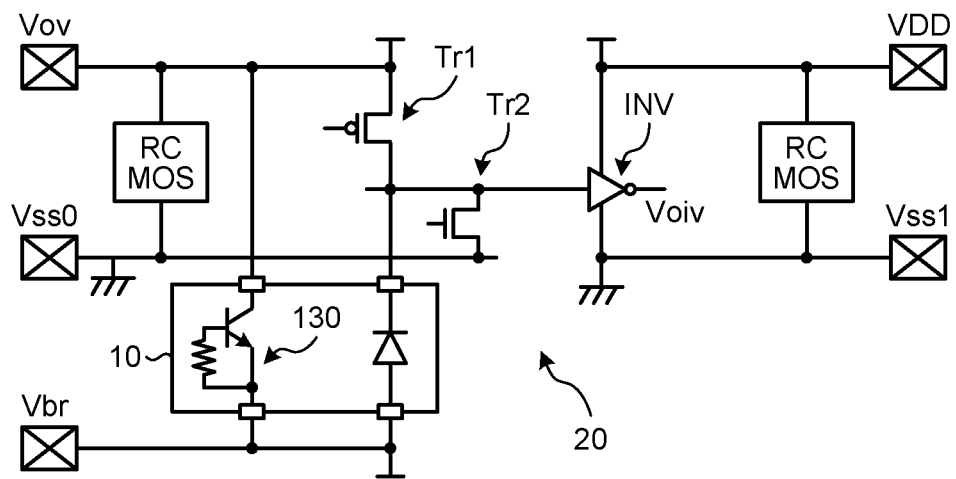
FIG. 6 is a diagram illustrating a circuit configuration of the light receiving device.

Next, a circuit configuration of the light receiving device 3 will be described with reference to FIGS. 5 and 6. FIGS. 5 and 6 are diagrams illustrating a circuit configuration of the light receiving device 3. FIG. 5 illustrates a circuit configuration of the protection element 130 having a PNP junction, and FIG. 6 illustrates a circuit configuration of the protection element 130 having a NPN junction. As illustrated in FIGS. 5 and 6, the APDs 101 and the protection element 130 are disposed on the first circuit substrate 10, and the transistors Tr1 and Tr2 and the inverter INV are disposed on the second circuit substrate 20. Further, the APDs 101 and the protection element 130 are electrically connected to the second circuit substrate 20 via Cu—Cu connection.

As illustrated in FIGS. 5 and 6, the APDs 101 has a cathode connected to the drain of the Tr1 and an anode connected to a voltage source Vbr of negative voltage corresponding to the breakdown voltage of the APD 101. Further, the source of the transistor Tr1 is connected to the voltage source Vov of positive voltage. A predetermined reference voltage (for example, the voltage Vss0 or the like) is connected to the gate of the transistor Tr1. The transistor Tr1 is a current source that outputs a current according to the voltage source Vov and the reference voltage from the drain. With such a configuration, a reverse bias is applied to the APDs 101.

Then, when photons are incident on the APDs 101 in a state of being charged by the potential at which the voltage source Vbr is applied to the anode, avalanche multiplication is started, a current flows from the cathode toward the anode, and accordingly, a voltage drop occurs in the APDs 101. Due to this voltage drop, the avalanche doubling is stopped when the anode-cathode voltage of the APDs 101 drops to the potential of the voltage source Vbr. Thereafter, the APDs 101 are charged by the current from the transistor Tr1 as a current source, and the state of the APDs 101 returns to the state before photon incidence (recharge operation).

A voltage extracted from a connection point between the drain of the transistor Tr1 and the cathode of the APDs 101 is input to the inverter INV. The inverter INV performs, for example, threshold determination based on the voltage VDD and the voltage Vss1 with respect to the voltage that is input (input voltage), and inverts the output signal Voiv every time the input voltage exceeds the threshold voltage in the positive direction or the negative direction.

More specifically, the inverter INV inverts the output signal Voiv at the first timing when the input voltage exceeds the threshold voltage in the voltage drop due to the avalanche multiplication corresponding to the incidence of photons on the APDs 101. Next, the APDs 101 are charged by the recharge operation, and the input voltage rises. The inverter INV inverts the output signal Voiv again at the second timing when the rising input voltage exceeds the threshold voltage. The width in the time direction between the first timing and the second timing is an output pulse according to incidence of photons on the APDs 101.

Then, as illustrated in FIGS. 5 and 6, as an ESD countermeasure for the APDs 101, the protection element 130 is connected in parallel to the APDs 101 on the voltage sources Vov and Vbr side. Specifically, one end of the protection element 130 is connected to the voltage source Vov of positive voltage, and the other end is connected to the voltage source Vbr of negative voltage.

For example, as Illustrated in FIG. 5, in the case of the protection element 130 which is a PNP junction bipolar transistor type, the emitter is connected to the voltage source Vov, and the collector is connected to the voltage source Vbr. In addition, the base and the emitter are connected via a resistor.

In addition, as Illustrated in FIG. 6, in the case of the protection element 130 which is a NPN junction bipolar transistor type, the emitter is connected to the voltage source Vov, and the collector is connected to the voltage source Vbr. In addition, the base and the emitter are connected via a resistor.

With such a configuration, when a surge voltage is generated in the voltage sources Vov and Vbr, the surge voltage is absorbed by entering the protection element 130, so that the APDs 101 can be protected by suppressing the entry of the surge voltage into the APDs 101.

<<Modification>>

Note that, to increase the area of the protection element 130 according to the region area of the APDs 101, the following two methods can be adopted:

Increase area of each protection element; and
Increase the number of protection elements.

Increase Area of Each Protection Element

Figure 7:
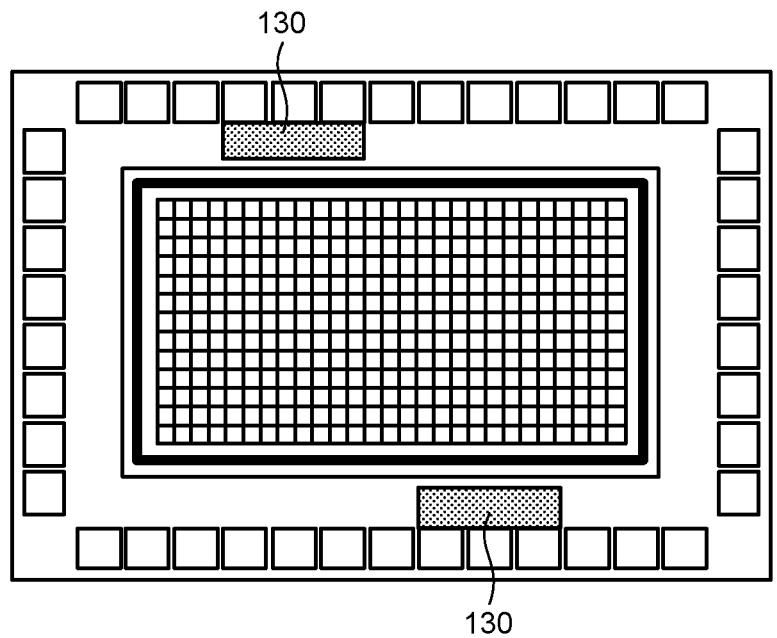
FIG. 7 is a view illustrating a modification of the protection element.

FIG. 7 is a view illustrating a modification of the protection element 130. As illustrated in FIG. 7, the area of each protection element 130 is increased according to the region area of the APDs 101. Although FIG. 7 illustrates a case where the areas of the two protection elements 130 are increased while being equal to each other, only one protection element 130 of the two protection elements 130 may be increased.

Increase the Number of Protection Elements

Figure 8:
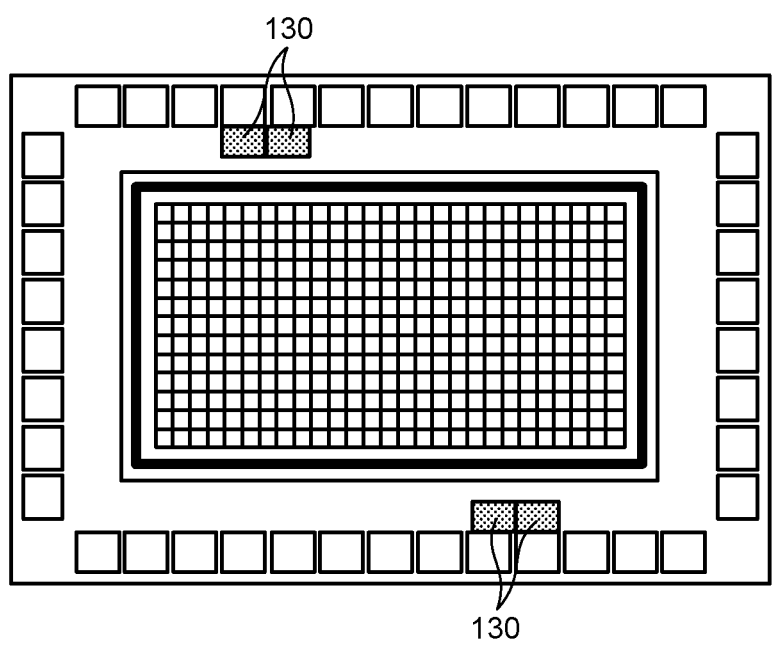
FIG. 8 is a view illustrating a modification of the protection element.

FIG. 8 is a view illustrating a modification of the protection element 130. As illustrated in FIG. 8, the area of the protection element 130 may be increased by increasing the number of protection elements 130 according to the region area of the APDs 101. Note that in FIG. 8, the plurality of protection elements 130 are adjacent to each other, however, the protection elements 130 may be separated from each other. In addition, the areas of the protection elements 130 may be the same or may be different.

As described above, by increasing the area of the protection element 130 according to the region area of the APDs 101, the APDs 101 can be protected with high accuracy against generation of a surge voltage.

Further, in the above-described embodiment, the case where the protection elements 130 are disposed only on the first circuit substrate 10 has been described, however, the protection elements may be divided and disposed on each of the first circuit substrate 10 and the second circuit substrate 20. This point will be described with reference to FIGS. 9 to 11.

Figure 9:
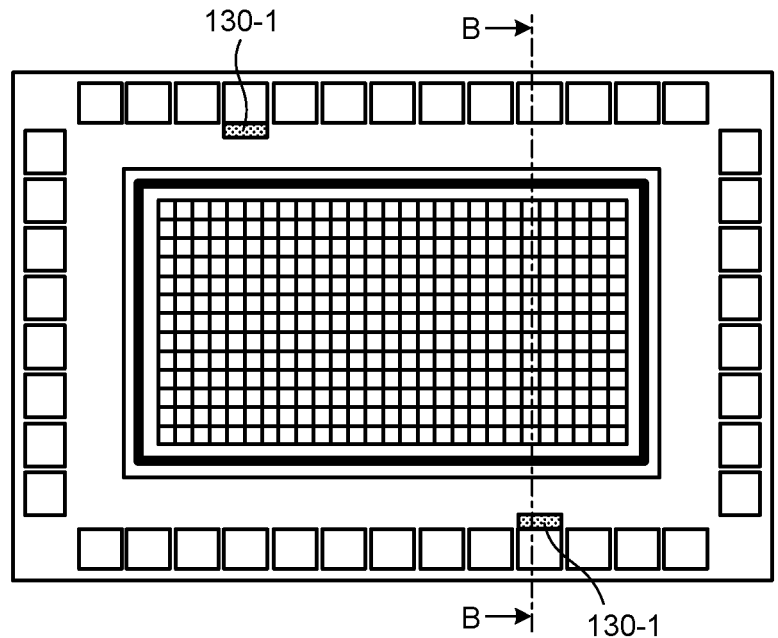
FIG. 9 is a view illustrating a modification of the protection element.
Figure 10:
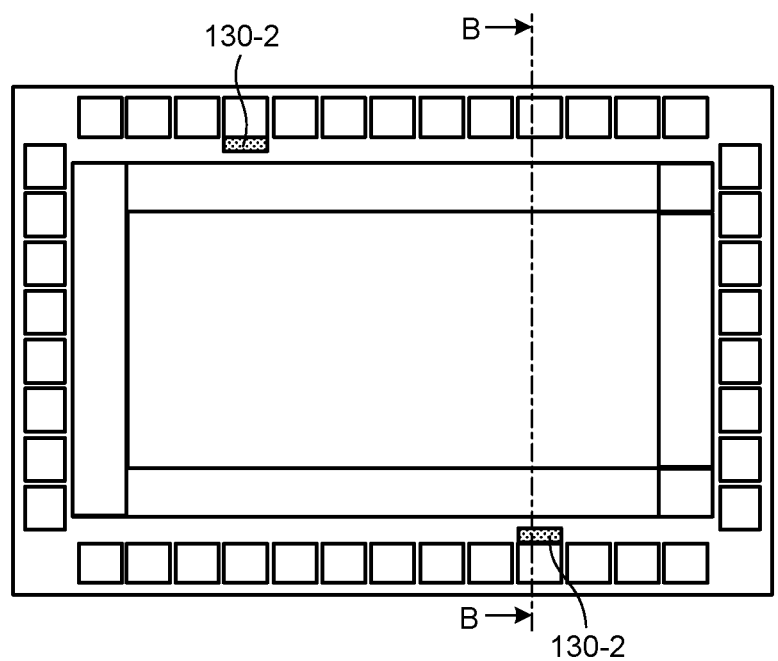
FIG. 10 is a view illustrating a modification of the protection element.
Figure 11:
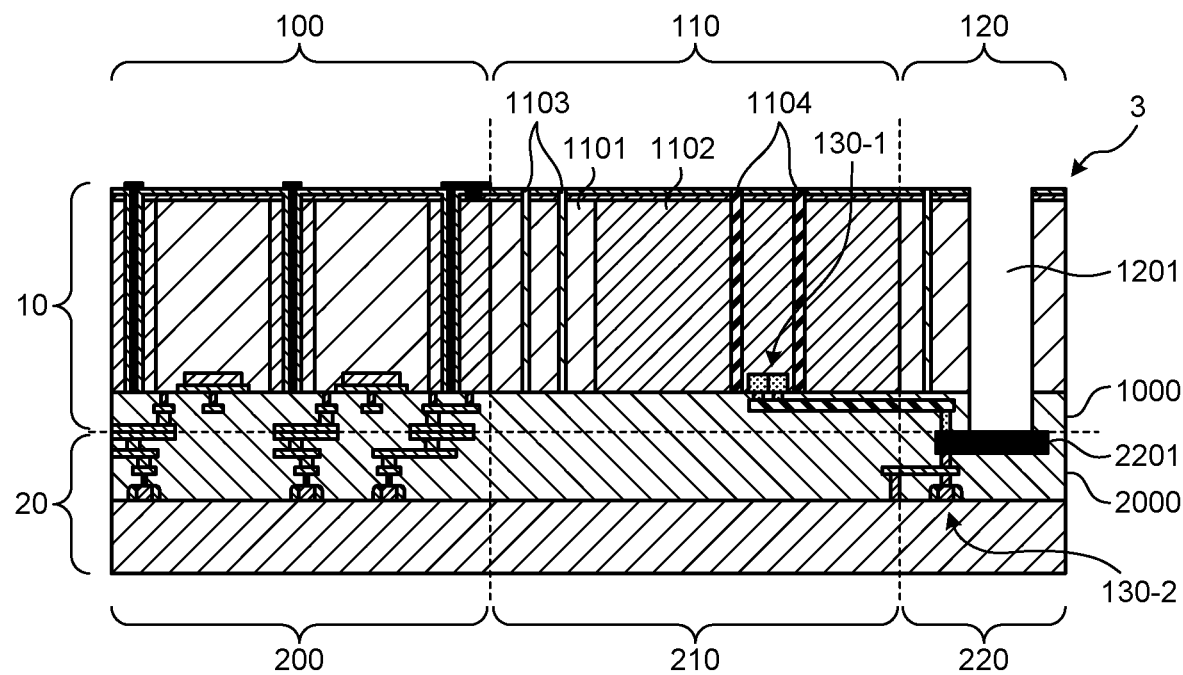
FIG. 11 is a view illustrating a modification of the protection element.

FIGS. 9 to 11 are views illustrating a modification of the protection element 130. FIG. 11 illustrates a cross section taken along line B-B in FIGS. 9 and 10. As illustrated in FIGS. 9 to 11, a part of the protection element 130 may be disposed on the second circuit substrate 20.

As illustrated in FIGS. 9 to 11, the first protection element 130-1 provided on the first circuit substrate 10 is disposed in the peripheral region 110 of the first circuit substrate 10. In addition, the second protection element 130-2 provided on the second circuit substrate 20 is disposed between the peripheral circuit region 210 and the pad region 220 on the second circuit substrate 20. In such a case, a predetermined region is required between the peripheral circuit region 210 and the pad region 220 on the second circuit substrate 20, but since the second protection element 130-2 is a part of the entire protection element, the region for the second protection element 130-2 can be made smaller than that in the related art.

In addition, as illustrated in FIG. 11, the cross-sectional structure of the second protection element 130-2 is different from that of the first protection element 130-1, but the cross-sectional structures may be the same as each other.

Furthermore, in the above-described embodiment, the protection element 130 of PNP junction using a p-type semiconductor region as a substrate has been described, but an NPN junction may be used.

In addition, the substrate of the protection element 130 may be an n-type semiconductor region. This point will be described with reference to FIGS. 12 and 13.

Figure 12:
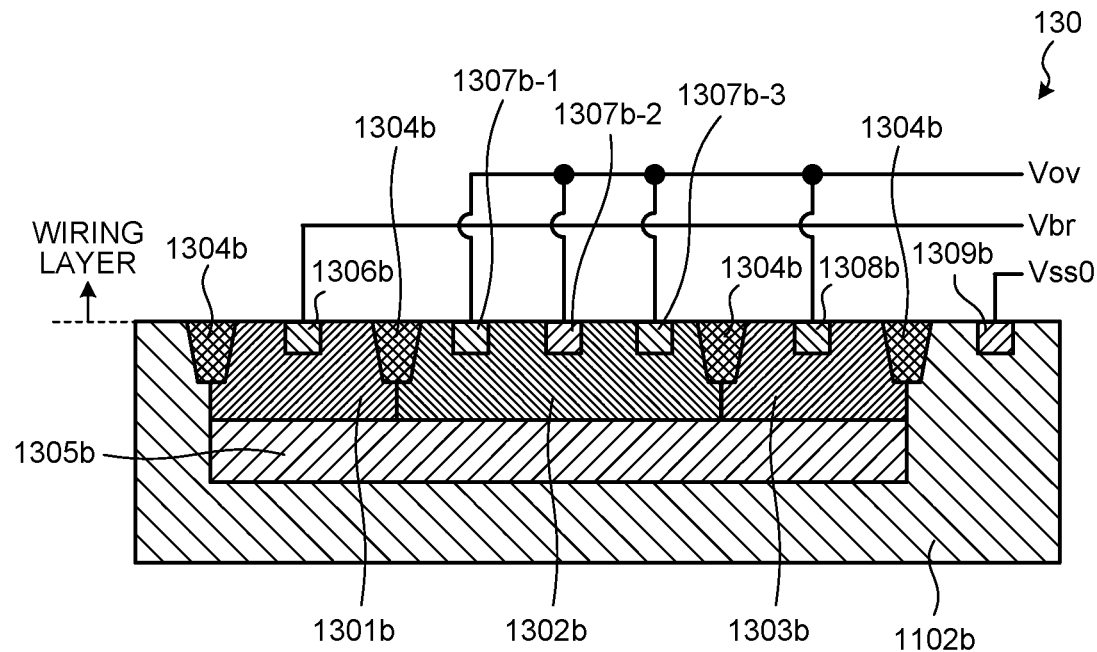
FIG. 12 is a view illustrating a modification of the protection element.
Figure 13:
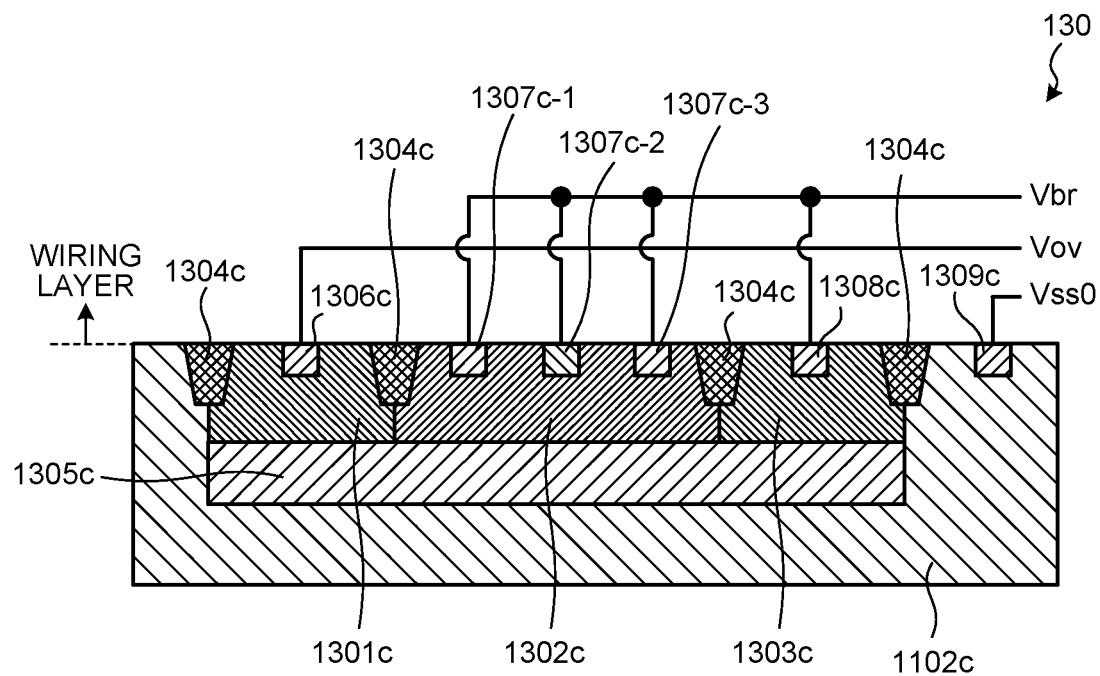
FIG. 13 is a view illustrating a modification of the protection element.

FIGS. 12 and 13 are views illustrating a modification of the protection element 130. FIG. 12 illustrates a case of a PNP junction using an n-type semiconductor region as a substrate, and FIG. 13 illustrates a case of an NPN junction using an n-type semiconductor region as a substrate.

Specifically, as illustrated in FIG. 12, in the case of a PNP junction using an n-type semiconductor region 1102$b$ as a substrate, the protection element 130 includes a p-well layer 1301$b$, a n-well layer 1302$b$, and a p-well layer 1303$b$ on the surface on the wiring layer 1000 side in the n-type semiconductor region 1102$b$. In addition, the p-well layer 1301$b$, the n-well layer 1302$b$, and the p-well layer 1303$b$ are separated from each other by a separation region 1304$b$.

In addition, the protection element 130 includes a deep p-well layer 1305$b$ in a region deeper than the p-well layer 1301$b$, the n-well layer 1302$b$, and the p-well layer 1303$b$.

Further, in the p-well layer 1301$b$, a high-concentration p-type semiconductor region 1306$b$ to be a connection point with a voltage source Vbr of negative voltage is formed. Further, in the n-well layer 1302$b$, a high-concentration p-type semiconductor region 1307b-1, a high-concentration n-type semiconductor region 1307b-2, and a high-concentration p-type semiconductor region 1307b-3, which are connection points with the voltage source Vov of positive voltage, are formed. Further, in the p-well layer 1303b, a high-concentration p-type semiconductor region 1308b to be a connection point with a voltage source Vbr of negative voltage is formed. Further, in the n-type semiconductor region 1102b, a high-concentration n-type semiconductor region 1309b to be a connection point with a reference voltage Vss0 (for example, 0V) is formed.

Specifically, as illustrated in FIG. 13, in the case of an NPN junction using an n-type semiconductor region 1102c as a substrate, the protection element 130 includes an n-well layer 1301c, a p-well layer 1302c, and an n-well layer 1303c on the surface on the wiring layer 1000 side in the n-type semiconductor region 1102c. In addition, the n-well layer 1301c, the p-well layer 1302c, and the n-well layer 1303c are separated from each other by a separation region 1304c.

In addition, the protection element 130 includes a deep p-well layer 1305c in a region deeper than the n-well layer 1301c, the p-well layer 1302c, and the n-well layer 1303c.

Further, in the n-well layer 1301c, a high-concentration n-type semiconductor region 1306c to be a connection point with the voltage source Vov of positive voltage is formed. Further, in the p-well layer 1302c, a high-concentration n-type semiconductor region 1307c-1, a high-concentration p-type semiconductor region 1307c-2, and a high-concentration n-type semiconductor region 1307c-3, which are connection points with the voltage source Vbr of negative voltage, are formed. Further, in the n-well layer 1303c, a high-concentration n-type semiconductor region 1308c to be a connection point with the voltage source Vov of positive voltage is formed. Further, in the n-type semiconductor region 1102c, a high-concentration n-type semiconductor region 1309c to be a connection point with a reference voltage Vss0 (for example, 0V) is formed.

The above-described distance measuring device 1 and the light receiving device 3 can be used in various cases of sensing light such as, for example, visible light, infrared light, ultraviolet light, and X-ray as described below.

- A device which captures an image to be provided for viewing, such as a digital camera and a mobile device with a camera function.
- A device to be provided for traffic, such as an in-vehicle sensor which captures images of portions in front of, behind, around, interior of, and the like of an automobile, a monitoring camera which monitors traveling vehicles and roads, and a range sensor which measures a distance between vehicles, and the like for safe driving such as automatic stop, and to recognize a state of a driver.
- A device to be provided for electric appliances such as a TV, a refrigerator, and an air conditioner to capture an image of gesture of a user to operate equipment in accordance with the gesture.
- A device to be provided for medical care and health care, such as an endoscope and an apparatus which captures images of vessels by receiving infrared light.
- A device to be provided for security, such as a security camera for crime prevention and a camera for personal authentication.
- A device to be provided for beauty care, such as a skin checker which captures an image of skin and a microscope which captures an image of scalp.
- A device to be provided for sports, such as an action camera and a wearable camera for sports use.
- A device to be provided for agriculture, such as a camera for monitoring states of fields and crops.

<<Further Application Example of Technology According to Present Disclosure>>

<Application Example to Mobile Body>

The technology according to the present disclosure may further be applicable to devices mounted on various types of mobile bodies such as automobiles, electric vehicles, hybrid electric vehicles, motorcycles, bicycles, personal mobilities, airplanes, drones, ships, and robots.

Figure 14:
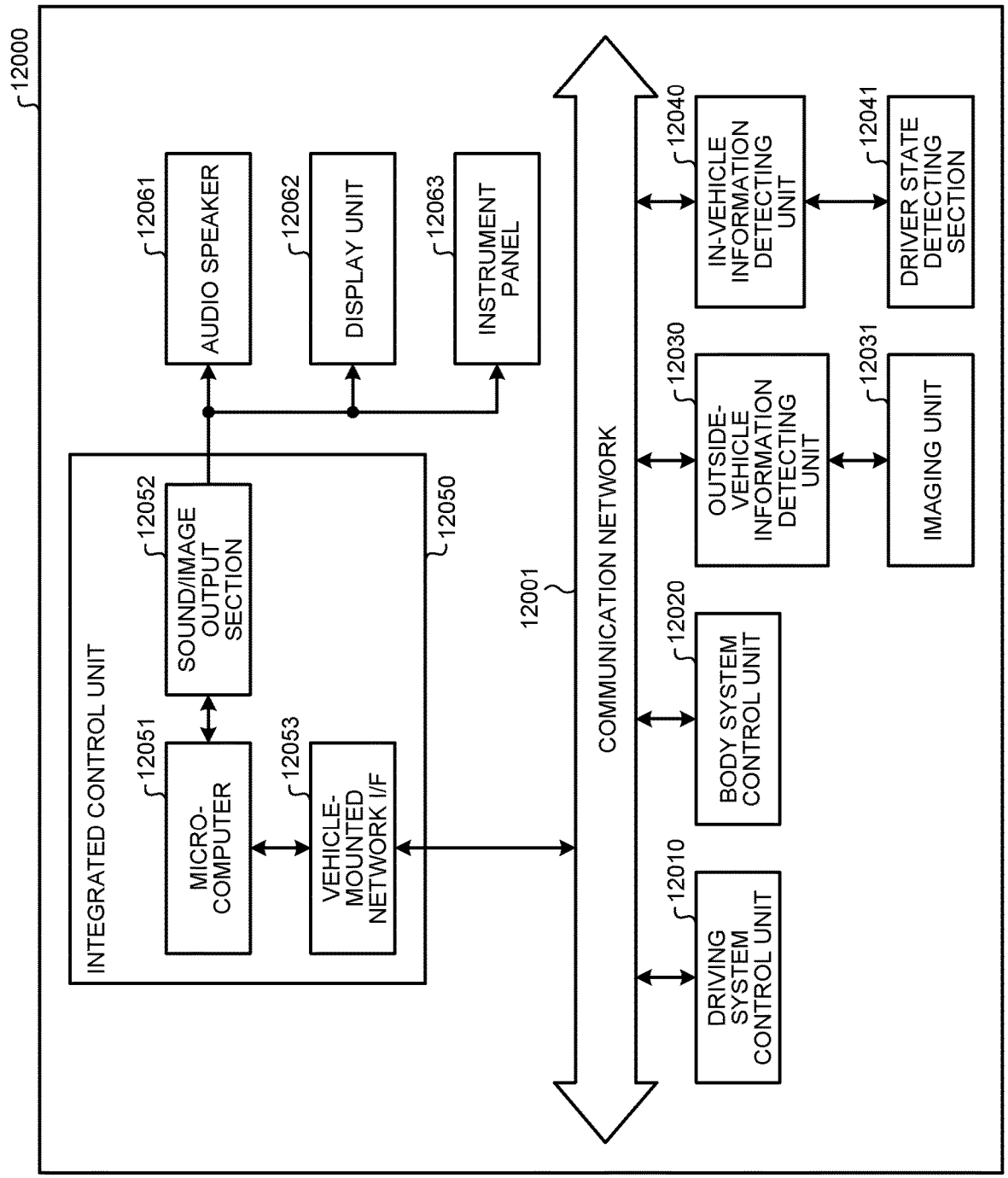
FIG. 14 is a block diagram illustrating a schematic configuration example of a vehicle control system which is an example of a mobile body control system to which the technology according to the present disclosure can be applied.

FIG. 14 is a block diagram illustrating a schematic configuration example of a vehicle control system which is an example of a mobile body control system to which a technology according to the present disclosure is applicable.

The vehicle control system 12000 includes a plurality of electronic control units connected to each other via a communication network 12001. In the example illustrated in FIG. 14, the vehicle control system 12000 includes a driving system control unit 12010, a body system control unit 12020, an outside-vehicle information detecting unit 12030, an in-vehicle information detecting unit 12040, and an integrated control unit 12050. In addition, as functional configurations of the integrated control unit 12050, a microcomputer 12051, a sound/image output section 12052, and a vehicle-mounted network interface (I/F) 12053 are illustrated.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging unit 12031. The outside-vehicle information detecting unit 12030 makes the imaging unit 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto. The outside-vehicle information detecting unit 12030 performs, for example, image processing to the received image, and on the basis of the result of the image processing, performs processing of detecting an object or processing of detecting a distance.

The imaging unit 12031 (light receiving device) is an optical sensor that receives light, and outputs an electrical signal corresponding to a received light amount of the light. The imaging unit 12031 can output the electrical signal as an image, or can output the electrical signal as information about a measured distance. In addition, the light received by the imaging unit 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the surroundings of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound or an image to an output device capable of visually or auditorily notifying an occupant of the vehicle or the outside of the vehicle of information. In the example of FIG. 14, an audio speaker 12061, a display unit 12062, and an instrument panel 12063 are exemplified as the output device. The display unit 12062 may, for example, include at least one of an on-board display or a head-up display.

Figure 15:
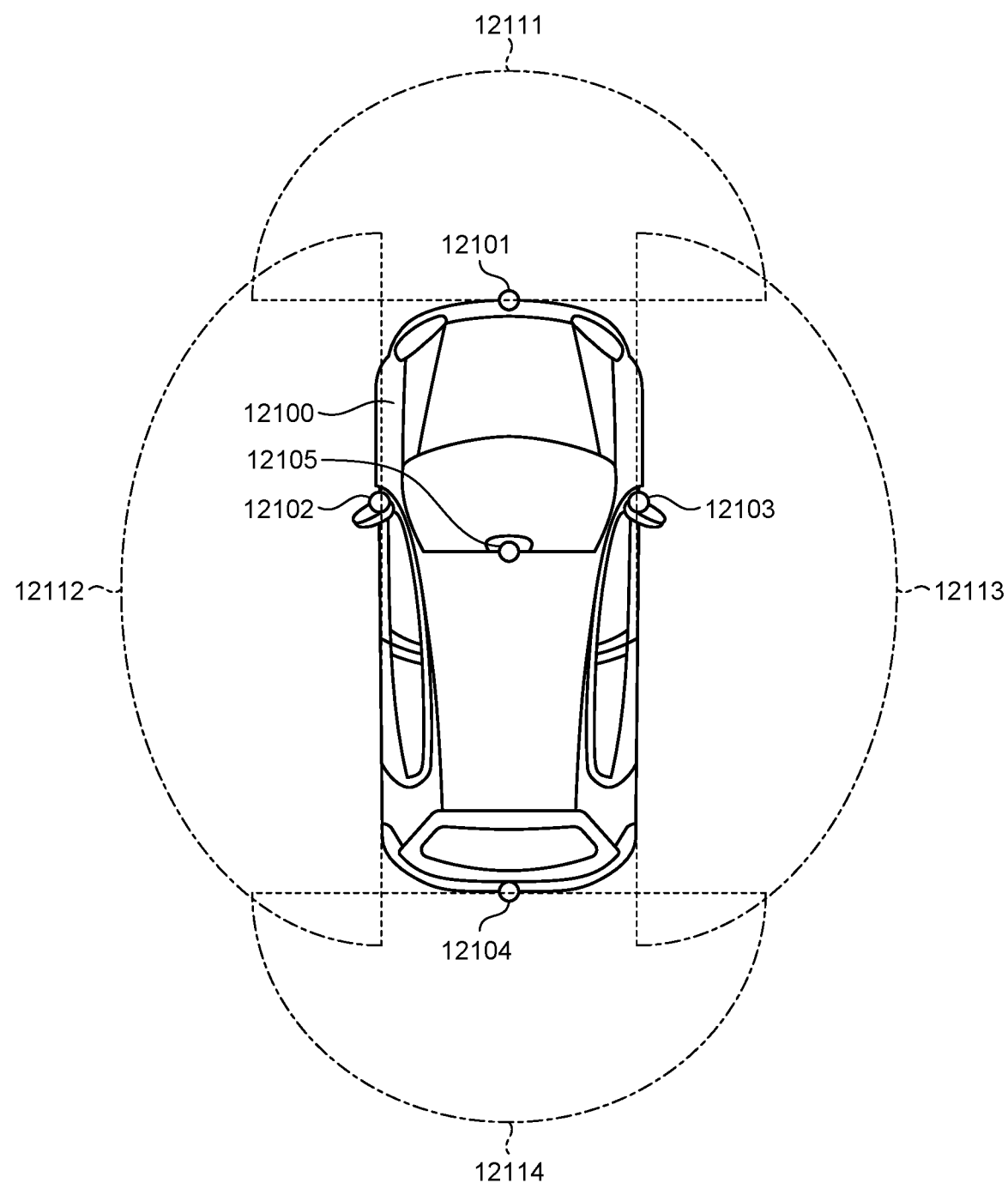
FIG. 15 is a diagram illustrating an example of an installation position of an imaging unit.

FIG. 15 is a diagram illustrating an example of an installation position of the imaging unit 12031. In FIG. 15, a vehicle 12100 includes imaging units 12101, 12102, 12103, 12104, and 12105 as the imaging unit 12031.

Imaging units 12101, 12102, 12103, 12104, and 12105 are positioned, for example, at the front nose, a side mirror, the rear bumper, the back door, and the upper part, or the like, of the windshield in the vehicle compartment of the vehicle 12100. The imaging unit 12101 provided to the front nose and the imaging unit 12105 provided to the upper part of the windshield in the vehicle compartment obtain mainly an image of the front of the vehicle 12100. The imaging units 12102 and 12103 attached to the side mirrors obtain mainly images of the areas on the sides of the vehicle 12100. The imaging unit 12104 provided to the rear bumper or the back door obtains mainly an image of the rear of the vehicle 12100. The image of the front of the vehicle obtained by the imaging units 12101 and 12105 is used mainly to detect a preceding vehicle, a pedestrian, an obstacle, a signal, a traffic sign, a lane, or the like.

Additionally, FIG. 15 illustrates an example of the imaging ranges of the imaging units 12101 to 12104. An imaging range 12111 represents the imaging range of the imaging unit 12101 provided to the front nose. Imaging ranges 12112 and 12113 respectively represent the imaging ranges of the imaging units 12102 and 12103 provided to the side mirrors. An imaging range 12114 represents the imaging range of the imaging unit 12104 provided to the rear bumper or the back door. A bird's-eye image of the vehicle 12100 as viewed from above is obtained by superimposing image data imaged by the imaging units 12101 to 12104, for example.

At least one of the imaging units 12101 to 12104 may have a function of obtaining distance information. For example, at least one of the imaging units 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging units 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/h). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, or the like, and other three-dimensional objects on the basis of the distance information obtained from the imaging units 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display unit 12062, and performs forced deceleration or avoidance steering via the driving system control unit 12010. The microcomputer 12051 can thereby assist in driving to avoid collision.

At least one of the imaging units 12101 to 12104 may be an infrared camera that detects infrared rays. The microcomputer 12051 can, for example, recognize a pedestrian by determining whether or not there is a pedestrian in imaged images of the imaging units 12101 to 12104. Such recognition of a pedestrian is, for example, performed by a procedure of extracting characteristic points in the imaged images of the imaging units 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging units 12101 to 12104, and thus recognizes the pedestrian, the sound/image output section 12052 controls the display unit 12062 so that a square contour line for emphasis is displayed so as to be superimposed on the recognized pedestrian. Further, the sound/image output section 12052 may also control the display unit 12062 so that an icon or the like representing the pedestrian is displayed at a desired position.

In the above, an example of the vehicle control system to which the technology related to the present disclosure can be applied is described. The technology according to the present disclosure can be applied to, for example, the imaging unit 12031 within the above-described configuration. Specifically, the distance measuring device 1 and the light receiving device 3 to which the above-described embodiments and modifications can be applied can be applied to the imaging unit 12031. By applying the technology of the present disclosure to the imaging unit 12031, it is possible to perform distance measurement with high accuracy.

Furthermore, the effects described in the present specification are merely examples and are not limited, and other effects may be provided.

<<Summary>>

As described above, the light receiving device 3 includes the first circuit substrate 10 and the second circuit substrate 20. Specifically, the APDs 101 and the protection element 130 that protects the APDs 101 are disposed on the first circuit substrate 10. The second circuit substrate 20 is stacked on the first circuit substrate 10, and a signal processing circuit that processes a signal output from the APDs 101 is disposed on the second circuit substrate 20.

As a result, it is not necessary to secure a dedicated region for the protection element 130 on the second circuit substrate 20, so that the area of the chip (the first circuit substrate 10 and the second circuit substrate 20) can be reduced.

Although the embodiments of the present disclosure have been described above, the technical scope of the present disclosure is not limited to the embodiments described above as it is, and various modifications can be made without departing from the gist of the present disclosure. In addition, constituent elements of different embodiments and modifications may be appropriately combined.

Furthermore, the effects of the embodiments described in the present specification are merely examples and are not limited, and other effects may be provided.

Note that the present technology can also have the following configurations.

(1)

A light receiving device including:

a first circuit substrate on which an avalanche photodiode (APD) and a protection element that protects the APD are disposed; and a second circuit substrate stacked on the first circuit substrate and on which a signal processing circuit that processes a signal output from the APD is disposed.

(2)

The light receiving device according to (1), wherein the protection element
is disposed on the first circuit substrate to have an area corresponding to a region area of the APDs.

(3)

The light receiving device according to (1) or (2), wherein the protection element
is a bipolar transistor type.

(4)

The light receiving device according to any one of (1) to (3), wherein
the APD and the protection element
are electrically connected to the second circuit substrate via Cu—Cu connection.

(5)

The light receiving device according to any one of (1) to (4), wherein
the APD has
a cathode connected to a drain of a transistor of which a source is connected to a voltage source of positive voltage and an anode connected to a voltage source of negative voltage, and
the protection element
is connected in parallel to the APD by one end of the protection element being connected to the voltage source of positive voltage and another end of the protection element being connected to the voltage source of negative voltage.

(6)

The light receiving device according to any one of (1) to (5), wherein
the protection element has a triple well structure of PNP junction or NPN junction.

(7)

A distance measuring device including:
a light source device; and
the light receiving device according to any one of (1) to (6) that receives reflected light generated by emitted light from the light source device being reflected by an object to be measured.

REFERENCE SIGNS LIST

1 Distance Measuring Device
2 Light Source Device
3 Light Receiving Device
10 First Circuit Substrate
20 Second Circuit Substrate
100 Pixel Region
110 Peripheral Region
120 Pad Region
130 Protection Element
200 Pixel Circuit Region
210 Peripheral Circuit Region
220 Pad Region

The invention claimed is:

1. A light receiving device, comprising:
a pad region;
a first circuit substrate;
an avalanche photodiode (APD) configured to:
   receive light from a light source device; and
   output an electrical signal based on the received light;
a protection element configured to protect the APD, wherein
   the APD and the protection element are on the first circuit substrate,
   the protection element is between the pad region and the APD are disposed; and
a second circuit substrate that comprises a signal processing circuit, wherein
   the signal processing circuit is configured to process the electrical signal, and
   the second circuit substrate is on the first circuit substrate.

2. The light receiving device according to claim 1, wherein an area of the protection element on the first circuit substrate corresponds to a region area of the APD.

3. The light receiving device according to claim 1, wherein the protection element is a bipolar transistor type.

4. The light receiving device according to claim 1, wherein each of the APD and the protection element is electrically connected to the second circuit substrate through Cu—Cu connection.

5. The light receiving device according to claim 1, wherein
the second circuit substrate further comprises a transistor,
the APD comprises a cathode and an anode,
the cathode is connected to a drain of the transistor,
the anode is connected to a voltage source of a negative voltage,
a source of the transistor is connected to a voltage source of a positive voltage,
the protection element is connected in parallel to the APD, and
a first end of the protection element is connected to the voltage source of the positive voltage and a second end of the protection element is connected to the voltage source of the negative voltage.

6. The light receiving device according to claim 1, wherein the protection element has a triple well structure of one of a PNP junction or a NPN junction.

7. A distance measuring device, comprising:
a light source device, wherein
   the light source device is configured to emit light towards an object, and
   the object reflects the light;
a light receiving device that comprises:
   a pad region;
   a first circuit substrate;
   an avalanche photodiode (APD) configured to:
      receive the reflected light; and
      output an electrical signal based on the received reflected light;
   a protection element configured to protect the APD, wherein
      the APD and the protection element are on the first circuit substrate, and
      the protection element is between the pad region and the APD; and
   a second circuit substrate that comprises a signal processing circuit configured to:
      process the electrical signal; and
      measure a distance of the object from the distance measuring device based on a difference between a time of the emission of the light and a time of the reception of the reflected light.

* * * * *